US012785680B1

(12) United States Patent
Kormanyos et al.

(10) Patent No.: US 12,785,680 B1
(45) Date of Patent: Nov. 3, 2026

(54) DEPLETION MODE INTEGRATED CIRCUIT WITH A LOGIC CIRCUIT THAT UTILIZES AN INPUT LEVEL SHIFTER AND AN N-CHANNEL PUSH-PULL OUTPUT CONFIGURATION

(71) Applicant: The Boeing Company, Arlington, VA (US)

(72) Inventors: Brian Kenneth Kormanyos, Edmonds, WA (US); Eric M. Kawalsky, Torrance, CA (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 19/194,380

(22) Filed: Apr. 30, 2025

(51) Int. Cl.
*H03K 19/0185* (2006.01)
*H03K 17/687* (2006.01)

(52) U.S. Cl.
CPC . *H03K 17/6871* (2013.01); *H03K 19/018507* (2013.01)

(58) Field of Classification Search
CPC ....... H03K 19/0175; H03K 19/017509; H03K 19/0185; H03K 19/018507; H03K 19/09446; H03K 19/09487
See application file for complete search history.

(56) References Cited

U.S. PATENT DOCUMENTS

| | | | | |
|---|---|---|---|---|
| 5,705,940 | A | 1/1998 | Newman et al. | |
| 9,755,645 | B1 | 9/2017 | Krasowski et al. | |
| 10,608,636 | B1 * | 3/2020 | Barlow | H03K 19/018507 |
| 2020/0044648 | A1 * | 2/2020 | Sharma | H02M 1/08 |
| 2023/0299768 | A1 * | 9/2023 | Bettencourt | H03K 17/6871 327/333 |

OTHER PUBLICATIONS

Extended European Search Report for European Application No. EP26159207.5 dated Jul. 15, 2026, 8 pages.

* cited by examiner

*Primary Examiner* — Jason M Crawford
(74) *Attorney, Agent, or Firm* — Harrity & Harrity, LLP

(57) ABSTRACT

A logic circuit includes an input stage and an output stage. The input stage includes an input level shifter comprising a first resistor and a second resistor, and a set of one or more input n-channel depletion mode devices that have respective gate terminals, source terminals, and drain terminals. A gate terminal of each input n-channel depletion mode device is configured as an input of the logic circuit, a drain terminal of the input n-channel depletion mode device is connected to a positive voltage supply, and a source terminal of the input n-channel depletion mode device is connected to a negative voltage supply through the input level shifter. The output stage includes an output of the logic circuit, a third resistor, a first output n-channel depletion mode device, a second output n-channel depletion mode device, and a set of one or more diodes arranged in an n-channel push-pull output configuration.

20 Claims, 4 Drawing Sheets

DEPLETION MODE INTEGRATED CIRCUIT WITH A LOGIC CIRCUIT THAT UTILIZES AN INPUT LEVEL SHIFTER AND AN N-CHANNEL PUSH-PULL OUTPUT CONFIGURATION

FIELD

The present disclosure relates generally to an integrated circuit, and to a depletion mode integrated circuit with a logic circuit that utilizes an input level shifter and an n-channel push-pull output configuration.

BACKGROUND

A depletion mode integrated circuit is a type of circuit that is naturally in an on-state (e.g., a conducting state) without application of any voltage at an input of the integrated circuit.

SUMMARY

An embodiment of the present disclosure provides an integrated circuit, comprising: a logic circuit that includes an input stage and an output stage, wherein: the input stage includes: a positive voltage supply; a negative voltage supply; an input level shifter comprising a first resistor and a second resistor; a set of one or more input n-channel depletion mode devices that have respective gate terminals, source terminals, and drain terminals, wherein, for each input n-channel depletion mode device: a gate terminal of the input n-channel depletion mode device is configured as an input of the logic circuit, a drain terminal of the input n-channel depletion mode device is connected to the positive voltage supply, and a source terminal of the input n-channel depletion mode device is connected to the negative voltage supply through the input level shifter; and the output stage includes: an output of the logic circuit; a third resistor; a first output n-channel depletion mode device; a second output n-channel depletion mode device; and a set of one or more diodes, wherein the output, the third resistor, the first output n-channel depletion mode device, the second output n-channel depletion mode device, and the set of one or more diodes are arranged in an n-channel push-pull output configuration.

Another embodiment of the present disclosure provides an integrated circuit, comprising: a logic circuit that includes an input stage and an output stage, wherein: the input stage includes: an input level shifter comprising a first resistor and a second resistor; a set of one or more input n-channel depletion mode devices that have respective gate terminals, source terminals, and drain terminals, wherein, for each input n-channel depletion mode device: a gate terminal of the input n-channel depletion mode device is configured as an input of the logic circuit, a drain terminal of the input n-channel depletion mode device is connected to a positive voltage supply, and a source terminal of the input n-channel depletion mode device is connected to a negative voltage supply through the input level shifter; and the output stage includes an output of the logic circuit, a third resistor, a first output n-channel depletion mode device, a second output n-channel depletion mode device, and a set of one or more diodes arranged in an n-channel push-pull output configuration.

Yet a further embodiment of the present disclosure provides a logic circuit, comprising: an input level shifter comprising a first resistor and a second resistor; a set of one or more input n-channel depletion mode devices that have respective gate terminals, source terminals, and drain terminals, wherein, for each input n-channel depletion mode device: a gate terminal of the input n-channel depletion mode device is configured as an input of the logic circuit, a drain terminal of the input n-channel depletion mode device is connected to a positive voltage supply, and a source terminal of the input n-channel depletion mode device is connected to a negative voltage supply through the input level shifter; and an output of the logic circuit, a third resistor, a first output n-channel depletion mode device, a second output n-channel depletion mode device, and a set of one or more diodes arranged in an n-channel push-pull output configuration.

The features, functions, and advantages described herein can be achieved independently in various implementations or can be combined in other implementations, further details of which are shown in the drawings and described below.

DETAILED DESCRIPTION

Figure 1A:
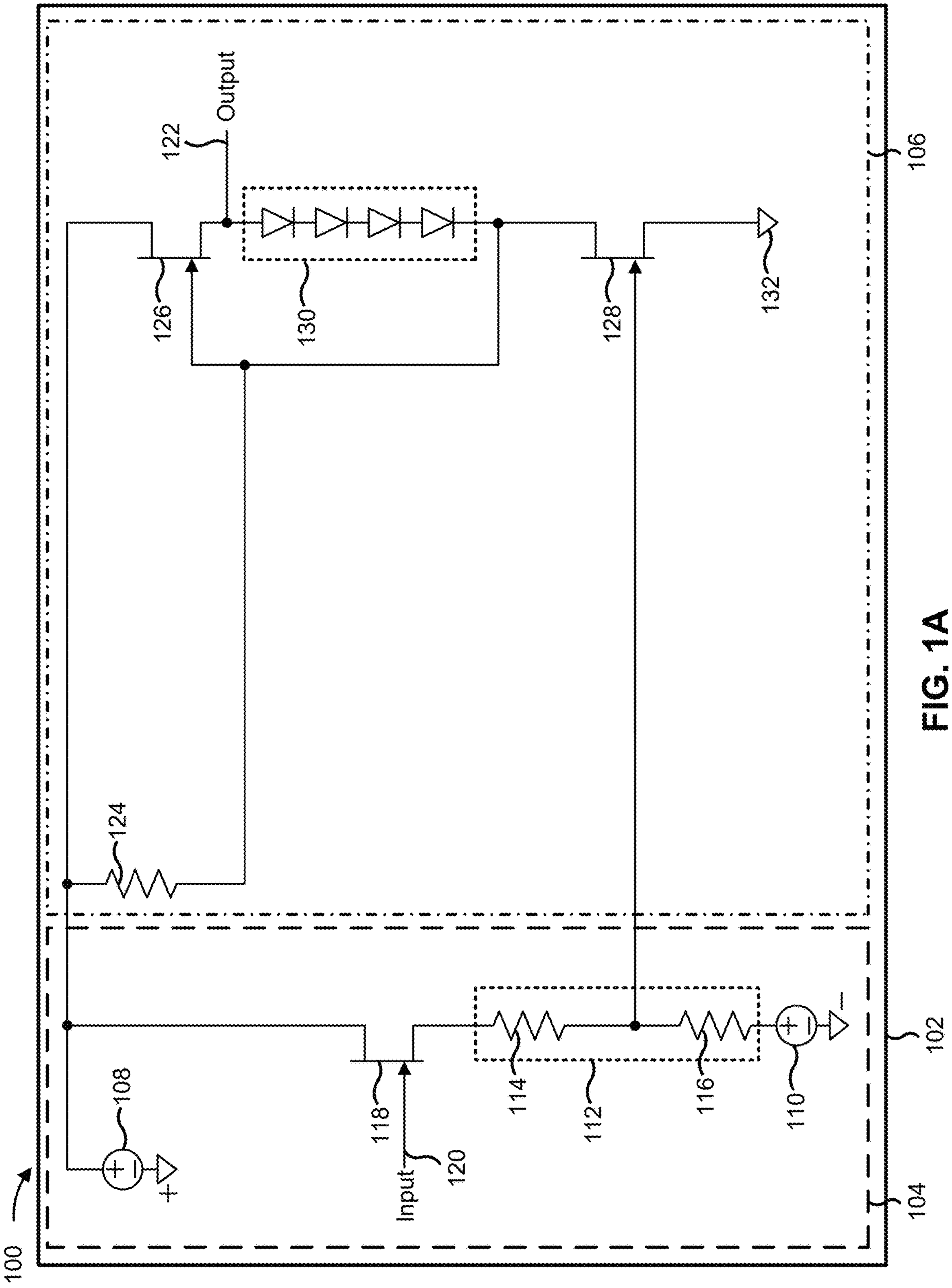
FIGS. 1A-IC are diagrams of an example implementation associated with a depletion mode integrated circuit with a logic circuit that utilizes an input level shifter and an n-channel push-pull output configuration.

The following detailed description of example implementations refers to the accompanying drawings. The same reference numbers in different drawings identify the same or similar elements.

A depletion mode integrated circuit typically supports devices of a single channel type, either p-channel or n-channel depletion mode devices. This constraint makes designing and implementing depletion mode logic circuits challenging, as conventional logic circuits typically incorporate both p-channel and n-channel devices to achieve efficient switching and logic functions.

When a logic circuit relies solely on depletion mode devices of a single channel type, additional circuit elements, such as load resistors, are often required in an output stage to generate an appropriate output voltage. However, the presence of such resistors can introduce several limitations. Resistors can restrict an available current, reducing the logic circuit's ability to drive multiple subsequent logic circuits, which impacts fan-out performance. Additionally, resistors can create an inherent delay (e.g., a resistor-capacitor (RC) delay), which slows the logic circuit's ability to transition between logic states and therefore limits an overall switching speed of the logic circuit. Furthermore, because resistors continuously dissipate power even when the logic circuit is not actively switching, the resistors reduce power efficiency and contribute to unnecessary energy consumption and heat generation. These factors make depletion mode logic circuits with output load resistors less practical for high-speed, low-power, or highly integrated applications.

Some implementations described herein include an integrated circuit that comprises a logic circuit that includes an input state and an output stage. The input stage includes a set of one or more input depletion mode devices of a single channel type (e.g., one or more input n-channel depletion mode devices), an input level shifter that includes a first resistor and a second resistor, a first voltage supply (e.g., a positive voltage supply), and a second voltage supply (e.g., a negative voltage supply). Each input depletion mode device includes a gate terminal that is configured as input of the logic circuit, a drain terminal that is connected to the first voltage supply, and a source terminal that is connected to the second voltage supply through the input level shifter. The output stage includes an output of the logic circuit, a third resistor, a first output depletion mode device of the single channel type (e.g., a first output n-channel depletion mode device), a second output depletion mode device of the single channel type (e.g., a second output n-channel depletion mode device), and a set of one or more diodes. The output, the third resistor, the first output depletion mode device, the second output depletion mode device, and the set of one or more diodes of the output stage are arranged in a push-pull output configuration of the single channel type (e.g., an n-channel push-pull output configuration).

Some implementations described herein utilize depletion mode technologies, such as gallium nitride (GaN), gallium arsenide (GaAs), and other wide-bandgap semiconductors, to implement an integrated circuit that incorporates the described logic circuit. These materials are particularly well-suited for high-temperature and high-radiation environments, such as those encountered by hypersonic vehicles, satellites, or other devices or vehicles configured for heat or radiation intensive applications, where traditional silicon-based circuits struggle to function reliably. Additionally, the design of the logic circuit allows for direct integration of digital circuits alongside existing analog circuits within wide-bandgap semiconductor technologies, such as GaN-based platforms. This capability enables the development of monolithic integrated systems, reducing both size and weight in applications like phased-array antennas and active electronically steered apertures (AESA), which require compact, high-performance electronic solutions.

Additionally, the logic circuit incorporates an input level shifter, consisting of a first and second resistor, within a logic functionality of the input stage to provide appropriate voltage levels to the output stage. The logic circuit also includes a push-pull output configuration that enhances power efficiency, increases fan-out capability, and improves speed and bandwidth by using active devices to drive the output voltage up or down instead of relying on resistors. This design delivers a stronger output drive for a given direct current (DC) power, resulting in higher overall performance.

Furthermore, idle current dissipation is reduced by removing resistive loads in the output stage of the logic circuit, enabling the logic circuit to drive multiple subsequent logic circuits without degrading performance. Additionally, reducing inherent resistor delays in the output stage enables faster logic transitions of the logic circuit and improved power efficiency. This enables a design and integration of complex digital circuits, including computer processing units (CPUs) and memory architectures, which can incorporate tens, hundreds, thousands, or more logic circuits using the described logic circuit configurations. Notably, the logic circuit configurations are also adaptable for use with discrete components outside of an integrated circuit environment, providing greater design flexibility.

Figure 1B:
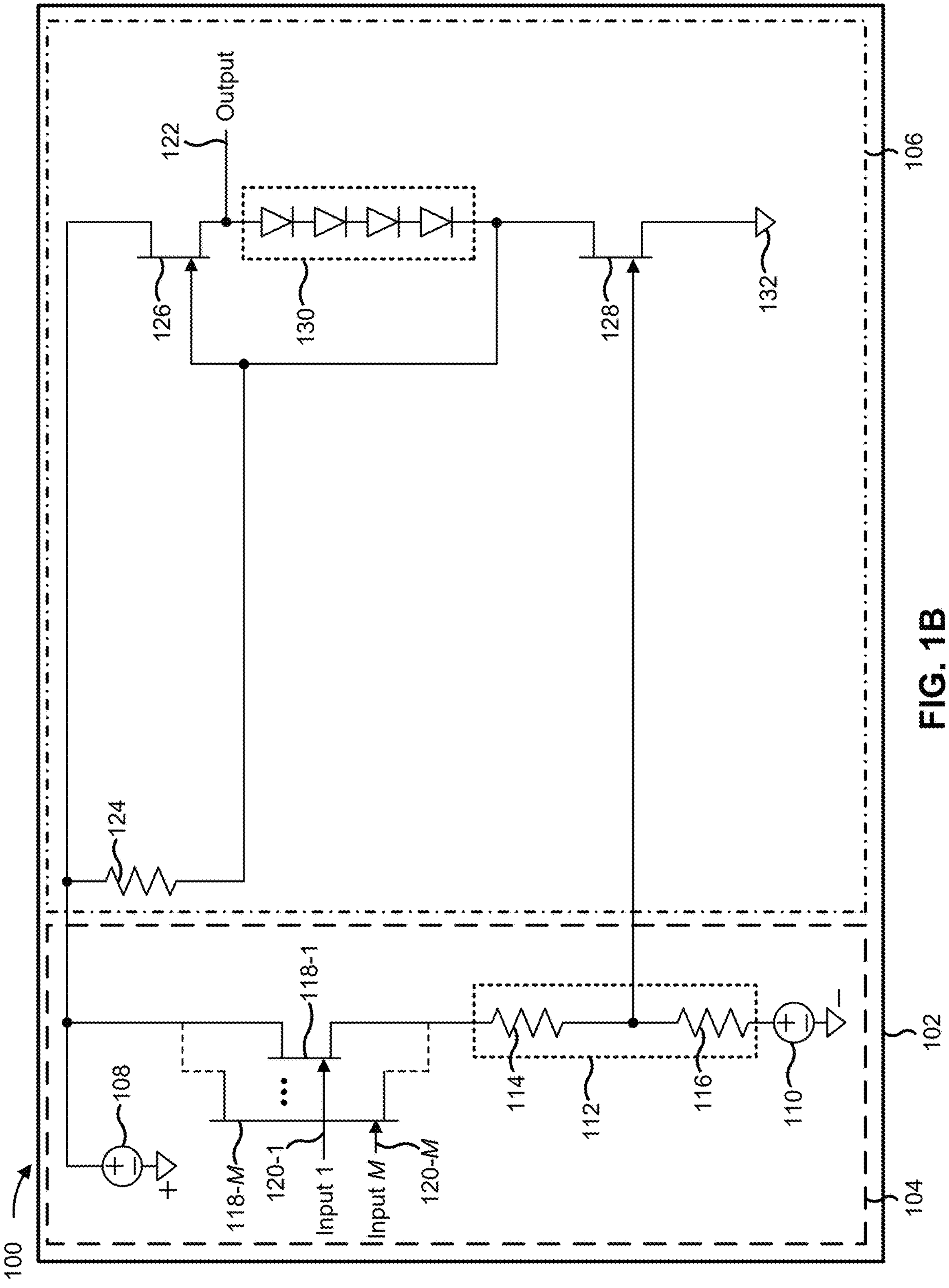
Figure 1C:
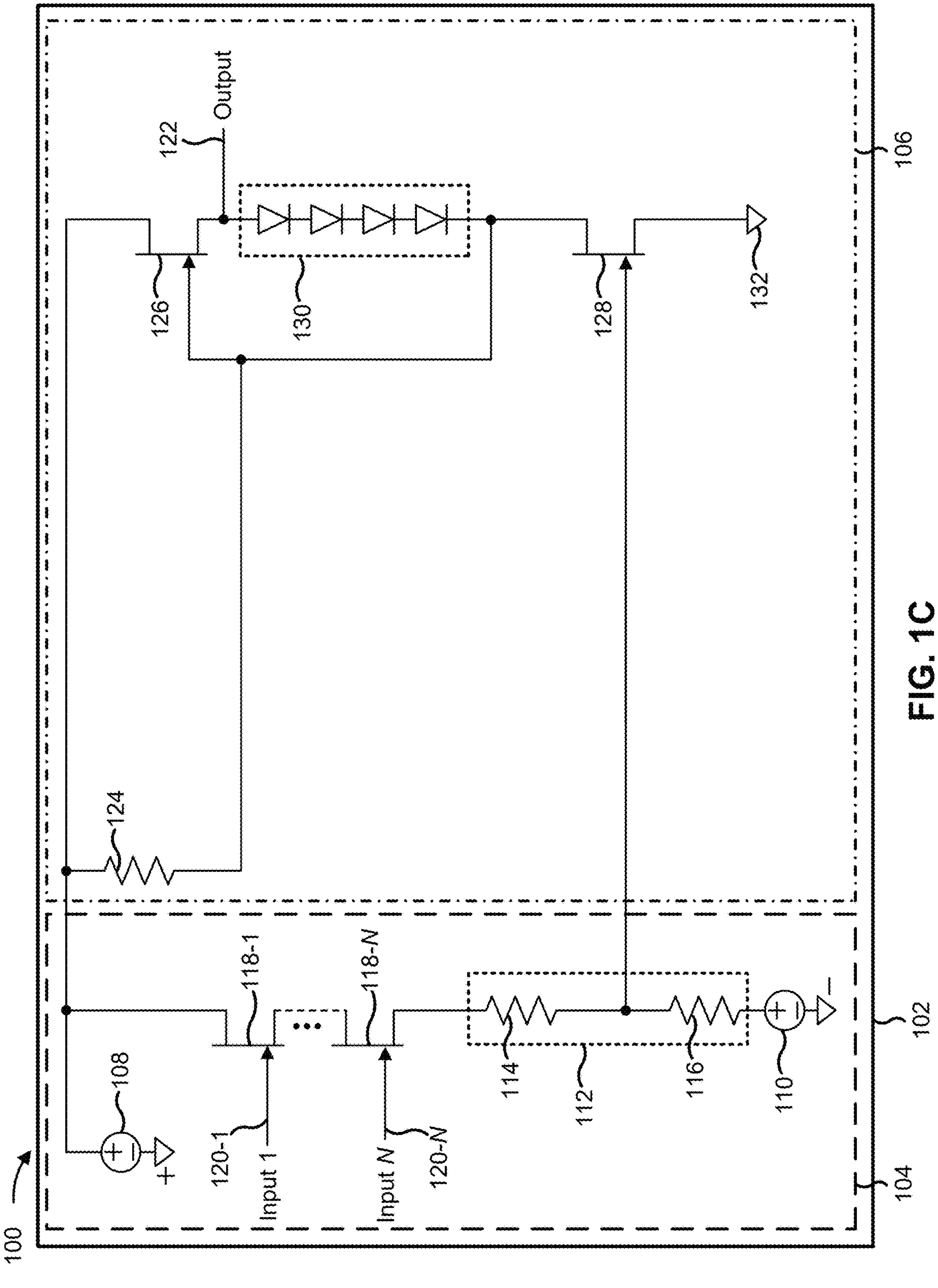

FIGS. 1A-1C are diagrams of an example implementation 100 associated with a depletion mode integrated circuit with a logic circuit that utilizes an input level shifter and an n-channel push-pull output configuration. As shown in FIGS. 1A-1C, example implementation 100 includes a logic circuit 102 that includes an input stage 104 and an output stage 106.

The logic circuit 102 is a depletion mode logic circuit, such as a GaN logic circuit or a GaAs logic circuit. In some implementations, the logic circuit 102 is configured as an inverse logic circuit. For example, FIG. 1A shows a configuration of the logic circuit 102 as a NOT logic circuit, FIG. 1B shows a configuration of the logic circuit 102 as a NOR logic circuit, and FIG. 1C shows a configuration of the logic circuit 102 as a NAND logic circuit.

As shown in FIGS. 1A-1C, the input stage 104 of the logic circuit 102 includes a first voltage supply 108 (shown as a positive voltage supply) and a second voltage supply 110 (shown as a negative voltage supply). The input stage 104 further includes an input level shifter 112 that comprises a first resistor 114 and a second resistor 116, and a set of one or more input n-channel depletion mode devices 118, and one or more inputs 120 (e.g., one or more inputs of the logic circuit 102). The output stage 106 includes an output 122 (e.g., an output of the logic circuit 102), a third resistor 124, a first output n-channel depletion mode device 126, a second output n-channel depletion mode device 128, and a set of one or more diodes 130.

The first voltage supply 108 and the second voltage supply 110 may be high-voltage voltage supplies. That is, a magnitude of a voltage of the each of the first voltage supply 108 and the second voltage supply 110 may be greater than or equal to a voltage threshold, such as 4 volts (V), to enable fast switching and driving of the logic circuit 102 and to provide sufficient negative gate-to-source voltage (V_GS) to turn off the set of one or more input n-channel depletion mode devices 118. Additionally, or alternatively, voltages of the first voltage supply 108 and the second voltage supply 110 may have equal magnitudes and opposite polarities. For example, as shown in FIGS. 1A-1C, the first voltage supply 108 may provide a positive voltage supply of 16 V and the second voltage supply 110 may provide a negative voltage supply of −16 V.

The input level shifter 112 is configured to provide level shifting (e.g., to shift a high voltage down or a low voltage up) and/or voltage scaling or biasing within the input stage 104 of the logic circuit 102, such as to enable a suitable voltage for the second output n-channel depletion mode device 128 of the output stage 106. For example, the first resistor 114 and the second resistor 116 may be configured to have particular resistances such that a voltage is shifted to be within a usable voltage range for the second output n-channel depletion mode device 128 (e.g., for a gate of the second output n-channel depletion mode device 128) of the output stage 106. In some implementations, the first resistor 114 and the second resistor 116 may have equal resistances, and optionally the first resistor 114, the second resistor 116, and the third resistor 124 may have equal resistances.

The set of one or more input n-channel depletion mode devices 118 includes, for example, one or more n-channel junction field effect transistors (JFETs), one or more n-channel metal semiconductor field effect transistors (MESFETs), one or more n-channel high electron mobility transistors (HEMTs), one or more n-channel modulation-doped field effect transistors (MODFET), one or more n-channel pseudomorphic high electron mobility transistors (pHEMTs), and/or one or more other types of n-channel devices (including epitaxially-grown n-channel devices). Accordingly, the set of one or more input n-channel depletion mode devices 118 have respective gate terminals, source terminals, and drain terminals. In some implementations, for each input n-channel depletion mode device 118, a gate terminal of the input n-channel depletion mode device 118 is configured as an input 120 of the logic circuit 102, a drain terminal of the input n-channel depletion mode device 118 is connected to the first voltage supply 108, and a source terminal of the input n-channel depletion mode device 118 is connected to the second voltage supply (e.g., through the input level shifter 112).

A configuration of the set of one or more input n-channel depletion mode devices 118 determines a specific type of inverse logic circuit that is implemented by the logic circuit 102. For example, as shown in FIG. 1A, the set of one or more input n-channel depletion mode devices 118 includes a single input n-channel depletion mode device 118, where a gate terminal of the input n-channel depletion mode device 118 is configured as a single input 120 of the logic circuit 102, a drain terminal of the input n-channel depletion mode device 118 is connected to the first voltage supply 108, and a source terminal of the input n-channel depletion mode device 118 is connected to the second voltage supply 110 (e.g., through the input level shifter 112). In this way, the logic circuit 102 is configured as a NOT logic circuit, as further described herein. As another example, as shown in FIG. 1B, the set of one or more input n-channel depletion mode devices 118 includes a plurality of input n-channel depletion mode devices 118 (shown as n-channel depletion mode devices 118-1 through 118-M) in a parallel configuration, where respective gate terminals of the plurality of input n-channel depletion mode devices 118 are configured as inputs 120 (shown as inputs 120-1 through 120-M) of the logic circuit 102, respective drain terminals of the plurality of input n-channel depletion mode devices 118 are connected to the first voltage supply 108, and respective source terminals of the plurality of input n-channel depletion mode devices 118 are connected to the second voltage supply 110 (e.g., through the input level shifter 112). In this way, the logic circuit 102 is configured as a NOR logic circuit, as further described herein. In another example, as shown in FIG. 1C, the set of one or more input n-channel depletion mode devices 118 includes a plurality of input n-channel depletion mode devices 118 (shown as n-channel depletion mode devices 118-1 through 118-N) in a series configuration, where respective gate terminals of the plurality of input n-channel depletion mode devices 118 are configured as inputs 120 (shown as inputs 120-1 through 120-N) of the logic circuit 102, respective drain terminals of the plurality of input n-channel depletion mode devices 118 are connected to the first voltage supply 108, and respective source terminals of the plurality of input n-channel depletion mode devices 118 are connected to the second voltage supply 110 (e.g., through the input level shifter 112). In this way, the logic circuit 102 is configured as a NAND logic circuit, as further described herein.

As further shown in FIGS. 1A-1C, the output 122, the third resistor 124, the first output n-channel depletion mode device 126, the second output n-channel depletion mode device 128, and the set of one or more diodes 130 of the output stage 106 are arranged in an n-channel push-pull output configuration. For example, the first output n-channel depletion mode device 126 has a first gate terminal, a first drain terminal, and a first source terminal, and the second output n-channel depletion mode device 128 has a second gate terminal, a second drain terminal, and a second source terminal. The first gate terminal of the first output n-channel depletion mode device 126 is connected to the first voltage supply 108, drain terminals of the set of one or more input n-channel depletion mode devices 118, and the first drain terminal of the first output n-channel depletion mode device 126 through the third resistor 124. The first drain terminal of the first output n-channel depletion mode device 126 is further connected to the first voltage supply 108 and the drain terminals of the set of one or more input n-channel depletion mode devices 118. The first source terminal of the first output n-channel depletion mode device 126 is connected to the output 122 and to the second drain terminal of the second output n-channel depletion mode device 128 through the set of one or more diodes 130 (that are configured to provide a voltage drop). The second gate terminal of the second output n-channel depletion mode device 128 is connected to the input level shifter 112. The second drain terminal of the second output n-channel depletion mode device 128 is further connected to the first gate terminal of the first output n-channel depletion mode device 126. The second source terminal of the second output n-channel depletion mode device 128 is connected to ground 132.

Accordingly, the input stage 104 and the output stage 106 enable the logic circuit 102 to be an inverse logic circuit. FIG. 1A shows the logic circuit 102 as a NOT logic circuit, where a signal at the input 120 is inverted at the output 122. For example, a signal at the input 120 that has a logic value of 1 (or HIGH) (e.g., where a voltage of the input signal is 0 V) is inverted to have a logic value of 0 (or LOW) (e.g., with a negative voltage) at the output 122, and a signal at the input 120 that has a logic value of 0 (or LOW) (e.g., with a negative voltage sufficient to close an input n-channel depletion mode device 118) is inverted to have a logic value of 1 (or HIGH) (e.g., with a voltage of 0 V). FIG. 1B shows the logic circuit 102 as a NOR logic circuit, where a signal at the output 122 has a logic value of 0 (or LOW) when one or more of M signals at the inputs 120-1 through 120-M have logic values of 1 (or HIGH), and a signal at the output 122 has a logic value of 1 (or HIGH) when all of M signals at the inputs 120-1 through 120-M have logic values of 0 (or LOW). FIG. 1C shows the logic circuit 102 as a NAND logic circuit, where a signal at the output 122 has a logic value of 1 (or HIGH) when one or more of N signals at the inputs 120-1 through 120-N have logic values of 0 (or LOW), and a signal at the output 122 has a logic value of 0 (or LOW) when all of N signals at the inputs 120-1 through 120-N have logic values of 1 (or HIGH).

The input stage 104 is configured to perform an inverse function (e.g., NOT, NOR, or NAND) and the output stage 106 is configured to provide an output drive (e.g., to push or pull a logic output at the output 122). For example, inputs at the one or more inputs 120 may cause the set of one or more input n-channel depletion mode devices 118 to be active (e.g., to close), such as when a signal at the input 120 of FIG. 1A has a logic value of 1 (or HIGH), when one or more of M signals at the inputs 120-1 through 120-M of FIG. 1B have logic values of 1 (or HIGH), or when all of N signals at the inputs 120-1 through 120-N have logic values of 1 (or HIGH). This causes the first voltage supply 108 to connect to the second voltage supply 110, which causes a voltage supplied to the second gate terminal of the second output n-channel depletion mode device 128, because of the input level shifter 112, to correspond to a logic value of 1 (or HIGH). This causes the second output n-channel depletion mode device 128 to be active (e.g., to close), and therefore the second output n-channel depletion mode device 128 pulls a signal at the output 122 to have a logic value of 0 (or LOW). As another example, inputs at the one or more inputs 120 may cause the set of one or more input n-channel depletion mode devices 118 to be inactive (e.g., to open), such as when a signal at the input 120 of FIG. 1A has a logic value of 0 (or LOW), when all of M signals at the inputs 120-1 through 120-M of FIG. 1B have logic values of 0 (or LOW), or when one or more of N signals at the inputs 120-1 through 120-N in FIG. 1C have logic values of 0 (or LOW). This causes the first voltage supply 108 to not connect to the second voltage supply 110, which causes a voltage supplied to the second gate terminal of the second output n-channel depletion mode device 128, because of the input level shifter 112, to correspond to a logic value of 0 (or LOW). This causes the second output n-channel depletion mode device 128 to be inactive (e.g., to open), and therefore the first output n-channel depletion mode device 126 pushes a signal at the output 122 to have a logic value of 1 (or HIGH).

While FIGS. 1A-1C and the corresponding description describe the logic circuit 102 as an n-channel depletion mode logic circuit, the logic circuit may be implemented as a p-channel depletion mode logic circuit. For example, the logic circuit 102 may include a set of one or more input p-channel depletion mode devices 118 (instead of a set of one or more input n-channel depletion mode devices 118), a first output p-channel depletion mode device 126 (instead of the first output n-channel depletion mode device 126), and a second output p-channel depletion mode device 128 (instead of the second output n-channel depletion mode device 128). Further, the polarities of the first voltage supply 108 and the second voltage supply 110 may be reversed (e.g., such that the first voltage supply 108 is a negative voltage supply and the second voltage supply 110 is a positive voltage supply) and a direction of the set of one or more diodes 130 may be reversed. Accordingly, in some implementations, the logic circuit 102 may be a depletion mode logic circuit of a single channel type.

As indicated above, FIGS. 1A-1C are provided as an example. Other examples may differ from what is described with regard to FIGS. 1A-1C.

Figure 2:
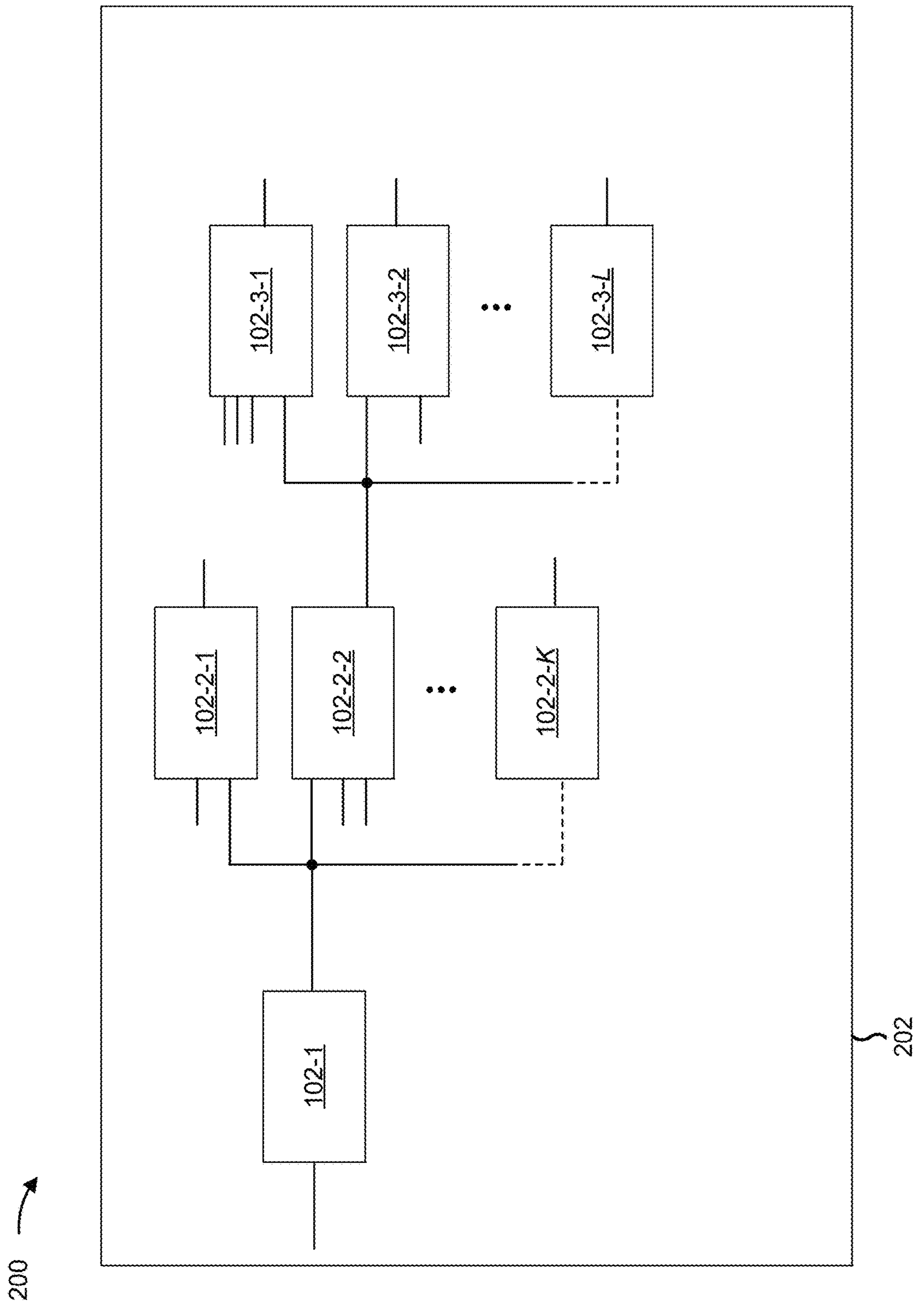
FIG. 2 is a diagram of an example implementation associated with a depletion mode integrated circuit with a logic circuit that utilizes an input level shifter and an n-channel push-pull output configuration.

FIG. 2 is a diagram of an example implementation 200 associated with a depletion mode integrated circuit with a logic circuit that utilizes an input level shifter and an n-channel push-pull output configuration.

As shown in FIG. 2, example implementation 200 includes an integrated circuit 202 that comprises a plurality of logic circuits 102. The integrated circuit 202 is a depletion mode integrated circuit, such as a GaN integrated circuit or a GaAs integrated circuit.

As shown in FIG. 2, the plurality of logic circuits 102 are positioned in a fan-out configuration (e.g., where a first level of logic circuits, comprising logic circuit 102-1, provide output for a second level of logic circuits, comprising logic circuits 102-2-1 through 102-2-K, which provide output for a third level of logic circuits, comprising logic circuits 102-2-1 through 102-2-K, and so on). The fan-out configuration is possible because, within each logic circuit 102, the input level shifter 112 is included with the input stage 104, and components of the output stage 106 are arranged in an n-channel push-pull output configuration. Thus, resistive loads are eliminated from the output stage of each logic circuit 102, which allows each logic circuit 102 to drive multiple subsequent logic circuits without degrading performance.

As indicated above, FIG. 2 is provided as an example. Other examples may differ from what is described with regard to FIG. 2.

The foregoing disclosure provides illustration and description, but is not intended to be exhaustive or to limit the implementations described herein to the precise forms that are described. Modifications and variations can be made in light of the above description or may be acquired from practice of the implementations described herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or described in the specification, these combinations are not intended to limit the implementations described herein. In fact, many of these features can be combined in ways not specifically recited in the claims and/or described in the specification. For example, the description includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and can be used interchangeably with "one or more." Further, as used herein, the article "the" is intended to include one or more items referenced in connection with the article "the" and can be used interchangeably with "the one or more." Furthermore, as used herein, the term "set" is intended to include one or more items (e.g., related items, unrelated items, or a combination of related and unrelated items,), and can be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and can be used interchangeably with "and/or," unless explicitly stated otherwise (e.g., if used in combination with "either" or "only one of").

What is claimed is:

1. An integrated circuit, comprising:
- a logic circuit that includes an input stage and an output stage, wherein:
  - the input stage includes:
    - a positive voltage supply;
    - a negative voltage supply;
    - an input level shifter comprising a first resistor and a second resistor;
    - a set of one or more input n-channel depletion mode devices that have respective gate terminals, source terminals, and drain terminals, wherein, for each input n-channel depletion mode device:
      - a gate terminal of the input n-channel depletion mode device is configured as an input of the logic circuit,
      - a drain terminal of the input n-channel depletion mode device is connected to the positive voltage supply, and
      - a source terminal of the input n-channel depletion mode device is connected to the negative voltage supply through the input level shifter; and
  - the output stage includes:
    - an output of the logic circuit;
    - a third resistor;
    - a first output n-channel depletion mode device;
    - a second output n-channel depletion mode device; and
    - a set of one or more diodes, wherein:

the output, the third resistor, the first output n-channel depletion mode device, the second output n-channel depletion mode device, and the set of one or more diodes are arranged in an n-channel push-pull output configuration.

2. The integrated circuit of claim 1, wherein, in the n-channel push-pull output configuration, the first output n-channel depletion mode device has a first gate terminal, a first drain terminal, and a first source terminal, and the second output n-channel depletion mode device has a second gate terminal, a second drain terminal, and a second source terminal, and wherein:

the first gate terminal of the first output n-channel depletion mode device is connected to the positive voltage supply, drain terminals of the set of one or more input n-channel depletion mode devices, and the first drain terminal of the first output n-channel depletion mode device through the third resistor;

the first drain terminal of the first output n-channel depletion mode device is further connected to the positive voltage supply and the drain terminals of the set of one or more input n-channel depletion mode devices;

the first source terminal of the first output n-channel depletion mode device is connected to the output and to the second drain terminal of the second output n-channel depletion mode device through the set of one or more diodes;

the second gate terminal of the second output n-channel depletion mode device is connected to the input level shifter;

the second drain terminal of the second output n-channel depletion mode device is further connected to the first gate terminal of the first output n-channel depletion mode device; and the second source terminal of the second output n-channel depletion mode device is connected to ground.

3. The integrated circuit of claim 1, wherein the integrated circuit is a gallium nitride (GaN) integrated circuit.

4. The integrated circuit of claim 1, wherein the integrated circuit is a depletion mode integrated circuit.

5. The integrated circuit of claim 1, wherein the set of one or more input n-channel depletion mode devices includes a single input n-channel depletion mode device and the logic circuit is configured as a NOT logic circuit.

6. The integrated circuit of claim 1, wherein the set of one or more input n-channel depletion mode devices includes a plurality of input n-channel depletion mode devices in a series configuration and the logic circuit is configured as a NAND logic circuit.

7. The integrated circuit of claim 1, wherein the set of one or more input n-channel depletion mode devices includes a plurality of input n-channel depletion mode devices in a parallel configuration and the logic circuit is configured as a NOR logic circuit.

8. The integrated circuit of claim 1, wherein voltages of the positive voltage supply and the negative voltage supply have equal magnitudes and opposite polarities.

9. The integrated circuit of claim 1, wherein the first resistor, the second resistor, and the third resistor have equal resistances.

10. An integrated circuit, comprising:

a logic circuit that includes an input stage and an output stage, wherein:

the input stage includes:

an input level shifter comprising a first resistor and a second resistor;

a set of one or more input n-channel depletion mode devices that have respective gate terminals, source terminals, and drain terminals, wherein, for each input n-channel depletion mode device:

a gate terminal of the input n-channel depletion mode device is configured as an input of the logic circuit, a drain terminal of the input n-channel depletion mode device is connected to a positive voltage supply, and a source terminal of the input n-channel depletion mode device is connected to a negative voltage supply through the input level shifter; and the output stage includes an output of the logic circuit, a third resistor, a first output n-channel depletion mode device, a second output n-channel depletion mode device, and a set of one or more diodes arranged in an n-channel push-pull output configuration.

11. The integrated circuit of claim 10, wherein:

a first gate terminal of the first output n-channel depletion mode device is connected to the positive voltage supply, drain terminals of the set of one or more input n-channel depletion mode devices, and a first drain terminal of the first output n-channel depletion mode device through the third resistor;

the first drain terminal of the first output n-channel depletion mode device is further connected to the positive voltage supply and the drain terminals of the set of one or more input n-channel depletion mode devices, a first source terminal of the first output n-channel depletion mode device is connected to the output and to a second drain terminal of the second output n-channel depletion mode device through the set of one or more diodes;

a second gate terminal of the second output n-channel depletion mode device is connected to the input level shifter;

the second drain terminal of the second output n-channel depletion mode device is further connected to the first gate terminal of the first output n-channel depletion mode device; and a second source terminal of the second output n-channel depletion mode device is connected to ground.

12. The integrated circuit of claim 10, wherein the integrated circuit is a gallium nitride (GaN) integrated circuit.

13. The integrated circuit of claim 10, wherein the integrated circuit is a depletion mode integrated circuit.

14. The integrated circuit of claim 10, wherein the set of one or more input n-channel depletion mode devices includes a single input n-channel depletion mode device and the logic circuit is configured as a NOT logic circuit.

15. The integrated circuit of claim 10, wherein the set of one or more input n-channel depletion mode devices includes a plurality of input n-channel depletion mode devices in a series configuration and the logic circuit is configured as a NAND logic circuit.

16. The integrated circuit of claim 10, wherein the set of one or more input n-channel depletion mode devices includes a plurality of input n-channel depletion mode devices in a parallel configuration and the logic circuit is configured as a NOR logic circuit.

17. A logic circuit, comprising:

an input level shifter comprising a first resistor and a second resistor;

a set of one or more input n-channel depletion mode devices that have respective gate terminals, source terminals, and drain terminals, wherein, for each input n-channel depletion mode device:

a gate terminal of the input n-channel depletion mode device is configured as an input of the logic circuit, a drain terminal of the input n-channel depletion mode device is connected to a positive voltage supply, and a source terminal of the input n-channel depletion mode device is connected to a negative voltage supply through the input level shifter; and an output of the logic circuit, a third resistor, a first output n-channel depletion mode device, a second output n-channel depletion mode device, and a set of one or more diodes arranged in an n-channel push-pull output configuration.

18. The logic circuit of claim 17, wherein:

a first gate terminal of the first output n-channel depletion mode device is connected to the positive voltage supply, drain terminals of the set of one or more input n-channel depletion mode devices, and a first drain terminal of the first output n-channel depletion mode device through the third resistor;

the first drain terminal of the first output n-channel depletion mode device is further connected to the positive voltage supply and the drain terminals of the set of one or more input n-channel depletion mode devices;

a first source terminal of the first output n-channel depletion mode device is connected to the output and to a second drain terminal of the second output n-channel depletion mode device through the set of one or more diodes;

a second gate terminal of the second output n-channel depletion mode device is connected to the input level shifter;

the second drain terminal of the second output n-channel depletion mode device is further connected to the first gate terminal of the first output n-channel depletion mode device; and a second source terminal of the second output n-channel depletion mode device is connected to ground.

19. The logic circuit of claim 17, wherein the logic circuit is a depletion mode logic circuit.

20. The logic circuit of claim 17, wherein the logic circuit is configured as an inverse logic circuit.

* * * * *